(12) United States Patent
Park et al.

(10) Patent No.: US 10,795,207 B2
(45) Date of Patent: Oct. 6, 2020

(54) QUANTUM ROD LAYER, METHOD OF FABRICATING THE SAME AND DISPLAY DEVICE INCLUDING THE SAME

(71) Applicant: LG DISPLAY CO., LTD., Seoul (KR)

(72) Inventors: Seung-Ryull Park, Goyang-si (KR); Hyun-Jin Park, Paju-si (KR); Han-Jin Ahn, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/984,625

(22) Filed: Dec. 30, 2015

(65) Prior Publication Data

US 2017/0031211 A1 Feb. 2, 2017

(30) Foreign Application Priority Data

Jul. 29, 2015 (KR) .......... 10-2015-0107152
Dec. 4, 2015 (KR) .......... 10-2015-0172338

(51) Int. Cl.
*G02F 1/1335* (2006.01)
*G02F 1/13357* (2006.01)
*G02F 1/1337* (2006.01)
*G02B 5/30* (2006.01)
*H01L 31/0352* (2006.01)
*G02F 1/35* (2006.01)

(52) U.S. Cl.
CPC ...... *G02F 1/133617* (2013.01); *G02F 1/1337* (2013.01); *G02F 1/13362* (2013.01); *G02F 1/133528* (2013.01); *B32B 2457/202* (2013.01); *G02B 5/3025* (2013.01); *G02F 1/133788* (2013.01); *G02F 1/3532* (2013.01); *G02F 2001/133614* (2013.01); *G02F 2202/36* (2013.01); *H01L 31/035227* (2013.01); *Y10T 428/1005* (2015.01); *Y10T 428/1036* (2015.01)

(58) Field of Classification Search
CPC ......... G02F 1/133617; G02F 1/133528; G02F 1/1337; G02F 1/13362; G02F 2001/133614; G02F 2202/36; G02F 1/3532; G02F 1/133788; G02F 2001/133531; G02B 5/3025; H01L 31/035227; Y10T 428/1005; Y10T 428/1036; B32B 2457/202
See application file for complete search history.

(56) References Cited

U.S. PATENT DOCUMENTS

2013/0107170 A1* 5/2013 Gee .............. G02F 1/13362
349/65
2014/0360860 A1* 12/2014 Miyachi ........ G02F 1/133788
204/157.69
2014/0362556 A1* 12/2014 Cho .................... B32B 3/30
362/19

(Continued)

FOREIGN PATENT DOCUMENTS

CN 103033990 A 4/2013
CN 103091892 A 5/2013

(Continued)

*Primary Examiner* — Eli D. Strah
(74) *Attorney, Agent, or Firm* — Birch, Stewart, Kolasch & Birch, LLP (57) ABSTRACT

An example of the present invention provides a quantum rod layer including: a photo-induced polymer including a base polymer aligned along a first direction and a photo-reactive group combined to the base polymer; and a quantum rod aligned along the first direction.

7 Claims, 7 Drawing Sheets

(56) References Cited

U.S. PATENT DOCUMENTS

2015/0275091 A1* 10/2015 Hatanaka ................ C08L 33/04
525/172

FOREIGN PATENT DOCUMENTS

| CN | 103135281 A | 6/2013 | | |
|---|---|---|---|---|
| CN | 103514813 A | 1/2014 | | |
| CN | 103797407 A | 5/2014 | | |
| CN | 104068553 A | 10/2014 | | |
| JP | WO 2013031462 A1 * | 3/2013 | ....... | G02F 1/133788 |
| JP | WO 201319125 A1 * | 12/2013 | .............. | C08L 33/04 |
| WO | WO 2012059931 A1 * | 5/2012 | ....... | G02F 1/133617 |

* cited by examiner

QUANTUM ROD LAYER, METHOD OF FABRICATING THE SAME AND DISPLAY DEVICE INCLUDING THE SAME

CROSS-REFERENCE TO RELATED APPLICATION

This application claims priority to and the benefit of Korean Patent Application No. 10-2015-0107152 filed in Korea on Jul. 29, 2015 and Korean Patent Application No. 10-2015-0172338 filed in Korea on Dec. 4, 2015, which are hereby incorporated by reference.

BACKGROUND OF THE INVENTION

Field of the Invention

Embodiments of the invention relate to a quantum rod layer, and more particularly, to a quantum rod layer having an improved polarization property, a method of fabricating the quantum rod layer and a display device including the quantum rod layer.

Discussion of the Related Art

Recently, as the society has entered in earnest upon an information age, a field of display devices that represent all sorts of electrical signals as visual images has developed rapidly. Flat panel display devices, such as a liquid crystal display (LCD) device, a plasma display panel (PDP) device, a field emission display (FED) device and an organic light emitting diode (OLED) device, have been introduced.

On the other hand, use of a quantum rod (QR) to the display device is researched or studied. The QR emits a polarized light due to anisotropy of light by a shape, while a quantum dot (QD) emits a non-polarized light due to isotropy of light.

A display device including the QR will be illustrated hereinafter with reference to a drawing.

Figure 1:
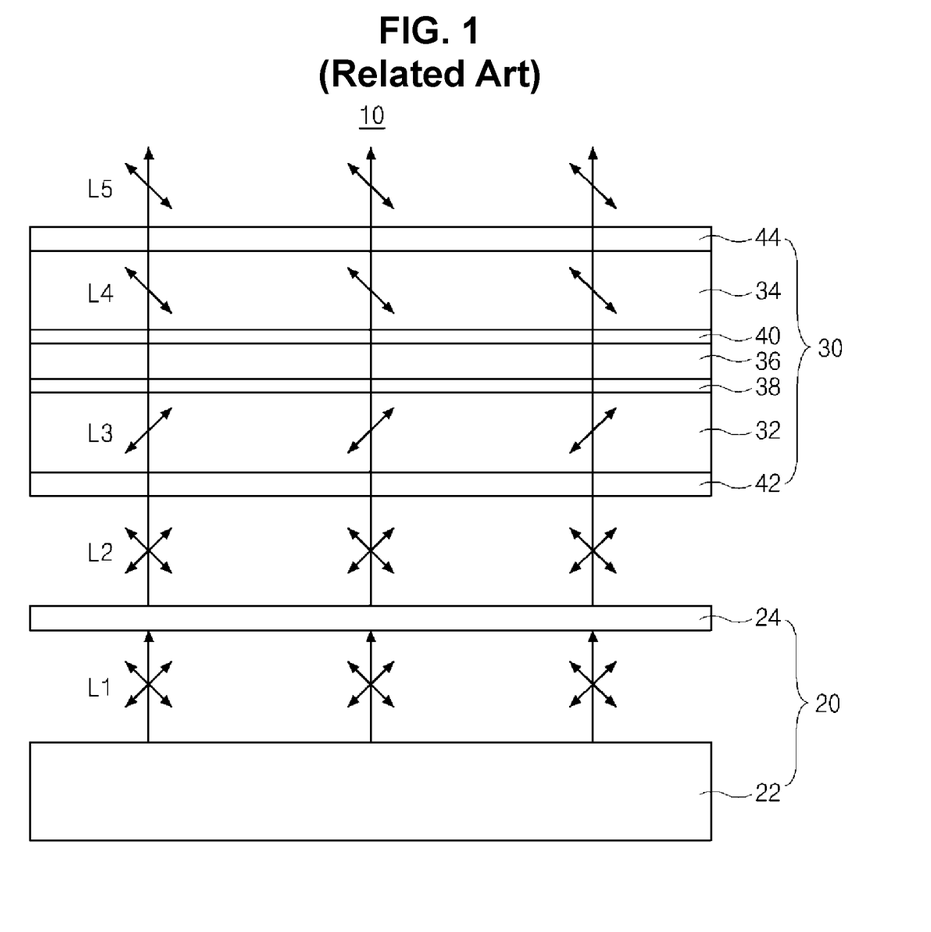
FIG. 1 illustrates a liquid crystal display device including a quantum rod according to the related art.

FIG. 1 is a liquid crystal display device including a quantum rod according to the related art.

In FIG. 1, a liquid crystal display (LCD) device 10 according to the related art includes a backlight unit 20 supplying a light and a liquid crystal panel 30 displaying an image using the light of the backlight unit 20.

The backlight unit 20 includes a light source part 22 emitting a light and a quantum rod (QR) layer 24 emitting a light whose peak wavelength property is improved using the light of the light source part 22.

The QR layer 24 includes a quantum rod. Since the QR a high extinction coefficient and an excellent quantum yield as compared with a general dye, the QR emits a strong fluorescent light. In addition, a wavelength of a visible light emitted from the QR is controlled by adjusting a diameter of the QR.

The QR has a polarization property such that a linearly polarized light having a polarization direction parallel to a length direction is emitted. In addition, the QR has an optical property such that an electron and a hole are separated and an emission is controlled by a stark effect when an external electric field is applied.

The liquid crystal panel 30 includes first and second substrates 32 and 34 facing and spaced apart from each other, a liquid crystal layer 36 interposed between the first and second substrates 32 and 34, lower and upper alignment layers 38 and 40 on inner surface, respectively, of the first and second substrates 32 and 34 and lower and upper polarizing plates 42 and 44 on outer surfaces, respectively, of the first and second substrates 32 and 34.

When the LCD device 10 has a normally black mode, the liquid crystal layer 36 changes a polarization state of a light passing through the liquid crystal layer 36 by application of a voltage, and polarization axes (or transmission axes) of the lower and upper polarizing plates 42 and 44 are disposed perpendicular to each other.

The lower and upper alignment layers 38 and 40 determine an initial alignment state of the liquid crystal layer 36.

To simplify a fabrication process, a method of forming the QR layer 24 using a soluble process has been suggested. For example, the fabrication process may be simplified and the thickness uniformity of the QR layer 24 may be improved by forming the QR layer 24 through the soluble process such as an inkjet, a dispensing, a roll-to-roll, a spin coating and a slit coating.

However, since the QR is randomly aligned in the QR layer 24 formed through the soluble process, the polarization property of the QR layer 24 is deteriorated. Since the QR layer 24 formed through the soluble process does not have little polarization property, the light source part 22 emits a first light L1 of a non-polarized state and the QR layer 24 emits a second light L2 of a non-polarized state using the first light L1.

While the second light L2 passes through the lower polarizing plate 42, the second light L2 becomes a third light L3 of a polarized state parallel to a polarization axis of the lower polarizing plate 42. While the third light L3 passes through the liquid crystal layer 36 where a voltage is applied, the third light L3 becomes a fourth light L4 of a polarized state parallel to a polarization axis of the upper polarizing plate 44 by change of the polarization state. The fourth light L4 passes through the upper polarizing plate 44 and a fifth light L5 of a polarized state parallel to the polarization axis of the upper polarizing plate 44 is emitted from the LCD device 10.

Here, when the second light L2 of a non-polarized state enters the lower polarizing plate 42, only a component parallel to the polarization axis of the lower polarizing plate 42 passes through the lower polarizing plate 42 and a component perpendicular to the polarization axis of the lower polarizing plate 42 is absorbed to dissipate. As a result, a part of the light supplied by the backlight unit 20 is lost and the brightness of the LCD device 10 is reduced. For example, about 40% to about 50% of the light supplied by the backlight unit 20 may be lost while passing through the lower polarizing plate 42.

To increase the brightness of the LCD device 10 by compensating the lost light, the QR layer 24 is formed to include a relatively large amount of QRs. Accordingly, the fabrication cost for the QR layer 24 increases. In addition, since an amount of a material for the QR, e.g., a material of a cadmium (Cd) family increases, the LCD device 10 may become vulnerable to an environmental regulation.

SUMMARY OF THE INVENTION

Accordingly, embodiments of the invention are directed to a quantum rod layer, a method of fabricating the same and a display device including the same that substantially obviate one or more of the problems due to limitations and disadvantages of the related art, and have other advantages.

An object of the invention is to provide a quantum rod layer where a polarization property is improved and a fabrication cost is reduced by improving a degree of alignment of a quantum rod using a photo-induced polymer, a method of fabricating the quantum rod layer and a display device including the quantum rod layer.

Another object of the invention is to provide a display device including a quantum rod layer where a fabrication cost is reduced, a brightness increases and a power consumption is reduced by using the quantum rod layer as a polarizing plate due to improvement of a degree of alignment of a quantum rod and a polarization property of the quantum rod layer.

Another object of the invention is to provide a display device including a quantum rod layer where a fabrication cost is reduced, a brightness increases and a power consumption is reduced by using the quantum rod layer as a polarizing plate and an alignment layer due to improvement of a degree of alignment of a quantum rod and a polarization property of the quantum rod layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the embodiments of the invention, as embodied and broadly described herein, an aspect of an embodiment of the invention provides a quantum rod layer including: a photo-induced polymer including a base polymer aligned along a first direction and a photo-reactive group combined to the base polymer; and a quantum rod aligned along the first direction.

In another aspect of the embodiment of the invention, provided is a method of fabricating a quantum rod layer including: forming a quantum rod composition layer on a base layer by coating a quantum rod composition solution including a photo-induced polymer, a quantum rod and a solvent; irradiating a UV ray of a polarized state onto the quantum rod composition layer; and performing a heat treatment for the quantum rod composition layer.

In another aspect of the embodiment of the invention, provided is a liquid crystal display device including: a light source part emitting a blue colored light; a quantum rod layer over the light source part, the quantum rod layer emitting a white colored light of a polarized state having a peak at wavelengths corresponding to red, green and blue colors using the blue colored light; first and second substrates over the light source part, the first and second substrates facing and spaced apart from each other; a liquid crystal layer between the first and second substrates; an upper alignment layer on an inner surface of the second substrate; and an upper polarizing plate on an outer surface of the second substrate.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 2:
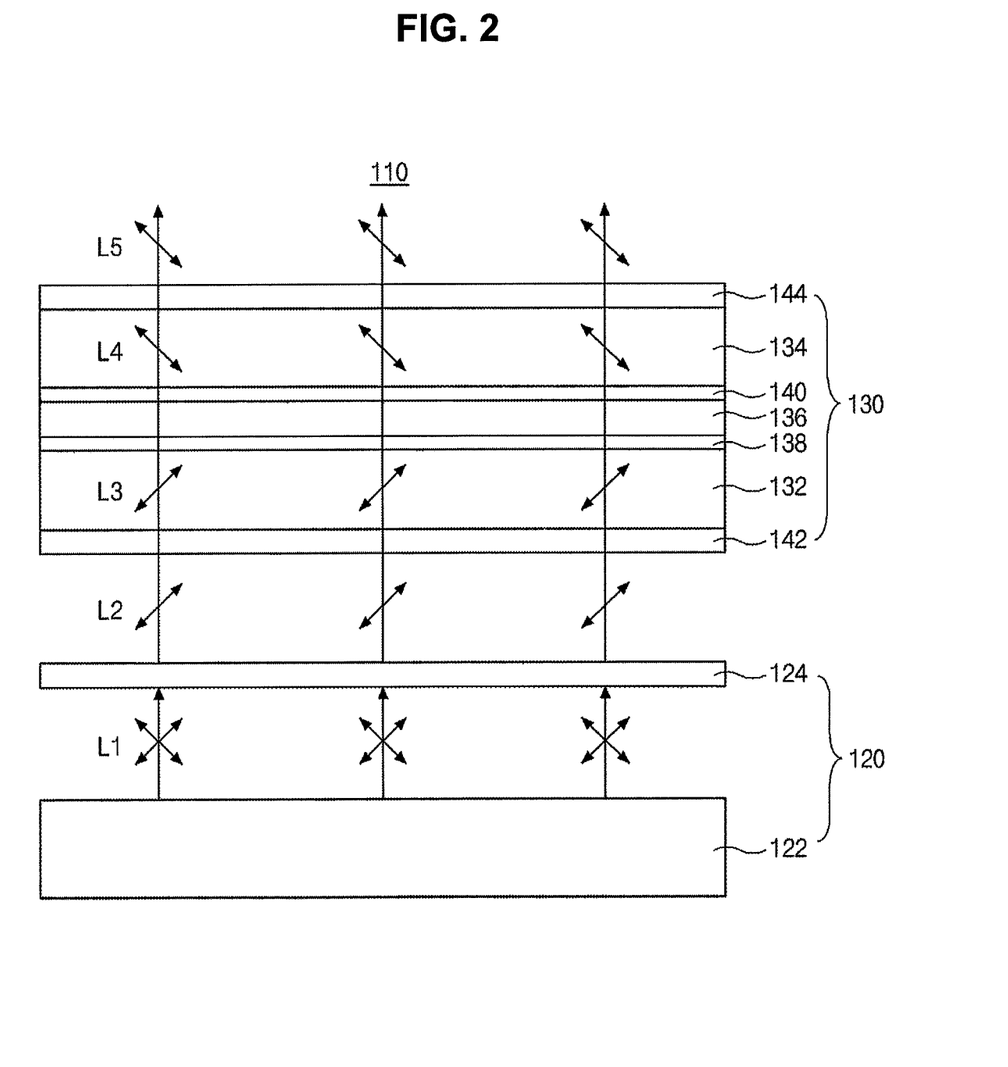
FIG. 2 illustrates a liquid crystal display device including a quantum rod layer according to a first embodiment of the present invention.

FIG. 2 is a liquid crystal display device including a quantum rod layer according to a first embodiment of the present invention. All the components of the liquid crystal display device according to all the embodiments of the present invention are operatively coupled and configured.

In FIG. 2, a liquid crystal display (LCD) device 110 according to a first embodiment of the present invention includes a backlight unit 120 supplying a light and a liquid crystal panel 130 displaying an image using the light of the backlight unit 120.

The backlight unit 120 includes a light source part 122 emitting a light and a quantum rod (QR) layer 124 emitting a light of a polarized state whose peak wavelength property is improved using the light of the light source part 122.

The light source part 122 may emit a blue colored light. For example, the light source part 122 of an edge type may include a light source such as a light emitting diode (LED) emitting a blue colored light and a light guide plate disposed at a side of the light source and transmitting the light of the light source by changing a path. In addition, the light source part 122 of a direct type may include a light source such as an LED emitting a blue colored light and an optical sheet over the light source and transmitting the light of the light source uniformly.

The QR layer 124 may emit a white colored light of a polarized state having a peak at a wavelength corresponding to red, green and blue colors using the blue colored light.

Figure 3A:
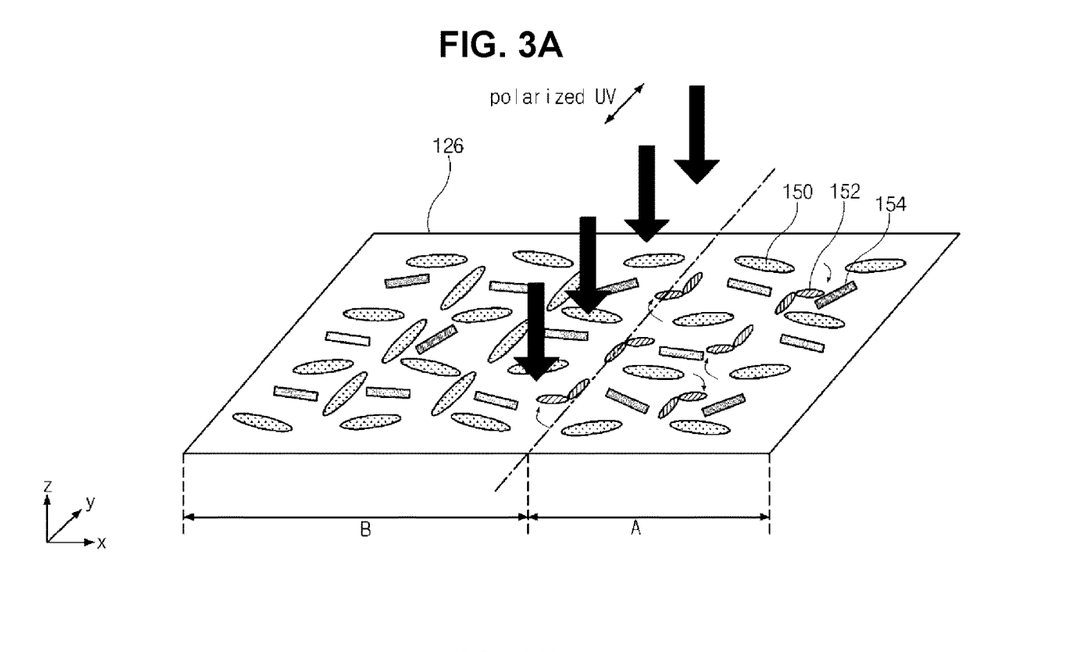
FIGS. 3A to 3D are perspective views showing a method of fabricating a quantum rod layer according to a first embodiment of the present invention.
Figure 3B:
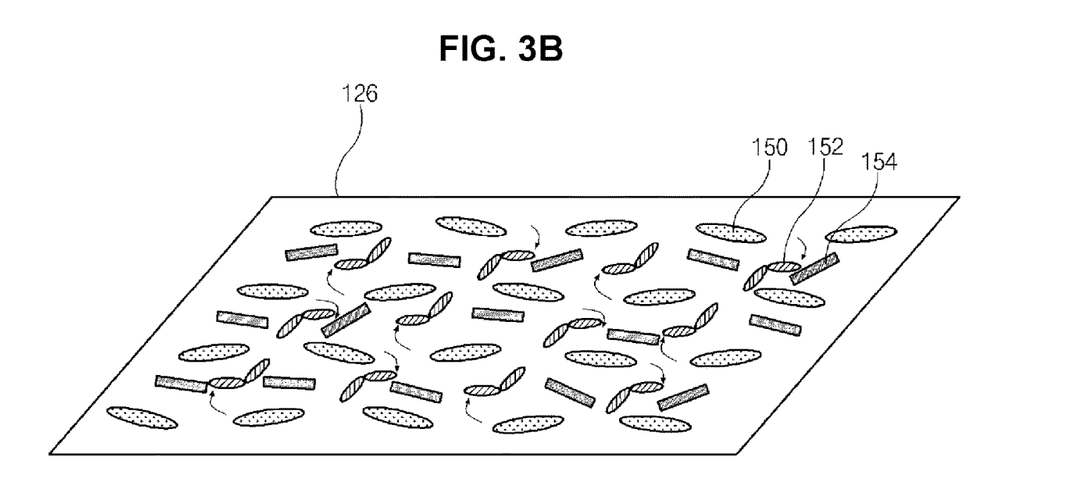
Figure 3C:
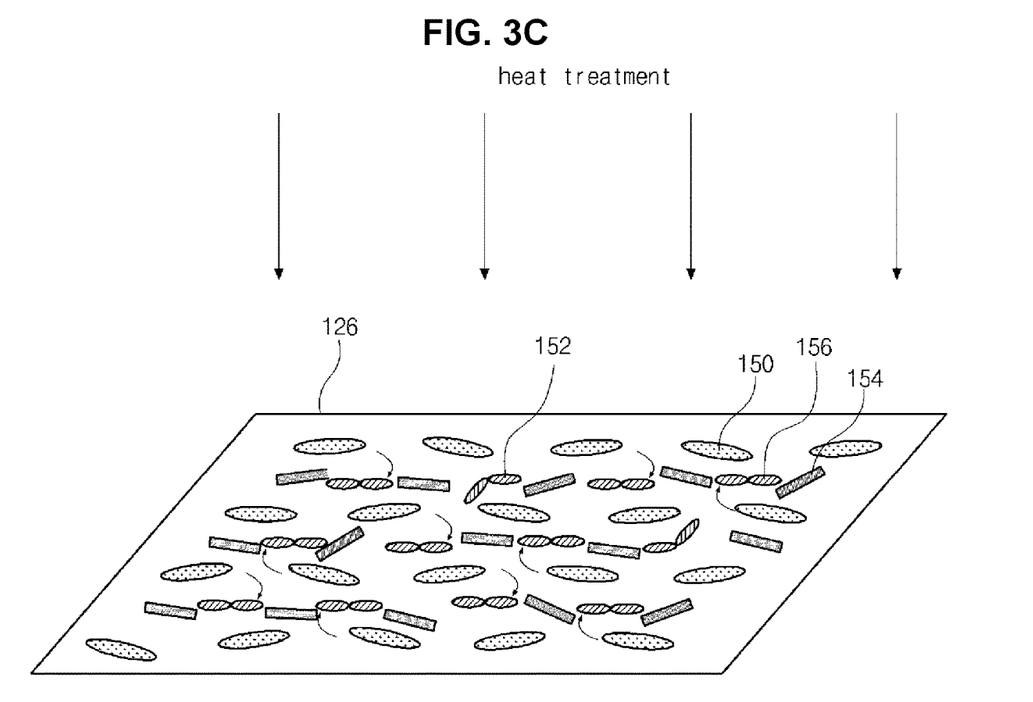
Figure 3D:
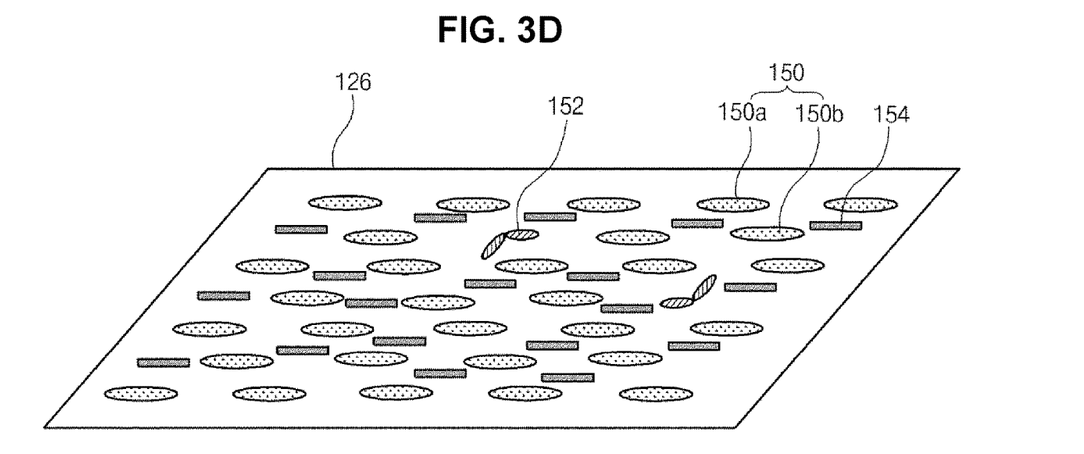

For example, the QR layer 124 may include a photo-induced polymer 150 (of FIG. 3D), a modified polymer 152 (of FIG. 3D) and a QR 154 (of FIG. 3D).

When an ultraviolet (UV) ray of a polarized state is irradiated onto the photo-induced polymer 150, the photo-induced polymer 150 is aligned and re-aligned along a direction perpendicular to a polarization direction of the ultraviolet (UV) ray, and the modified polymer 152 is generated by modification of the photo-induced polymer 150 aligned along a direction parallel to the polarization direction of the UV ray. The photo-induced polymer 150 and the modified polymer 152 will be illustrated in FIGS. 3A to 3D.

The QR 154 has a photoluminescence property of emitting a light using an incident light and is aligned along a direction perpendicular to the polarization direction of the UV ray by the photo-induced polymer 150.

Since the degree of alignment of the QR 154 is improved by the photo-induced polymer 150, the QR layer 124 may emit a light of a polarized state and a polarization state of the light emitted from the QR layer 124 is improved.

The QR 154 includes a core formed of the II-VI, III-V, IV-VI or semiconductor material and a shell for protecting the core. To increase a quantum efficiency of the core, a material for the shell may be appropriately selected and an appropriate ligand may be added for a dispersion property and a soluble process.

For example, the II-VI semiconductor material may include CdS, CdSe, CdTe, ZnS or ZnSe, or any combination thereof, the III-V semiconductor material may include GaAs, GaP, GaAs—P, Ga—Sb, InAs, InP, InSb, AlAs, AlP or AlSb, or any combination thereof, the IV-VI semiconductor material may include PbS, PbSe or PbTe, or any combination thereof, and the semiconductor material may include $CuInSe_2$, $CuIS_2$ or $AgInS_2$, or any combination thereof. In addition, graphene may be used as the QR.

The QR layer 124 may be formed directly on the backlight unit 120 or the liquid crystal panel 130. Alternatively, the QR layer 124 may be formed as a film including at least one of a base layer, an adhesive layer, a moisture blocking layer, a contamination preventing layer and an optical compensating layer thereon or thereunder and the film of the QR layer 124 may be attached to the backlight unit 120 or the liquid crystal panel 130.

The liquid crystal panel 130 includes first and second substrates 132 and 134 facing and spaced apart from each other, a liquid crystal layer interposed between the first and second substrates 132 and 134, lower and upper alignment layers 138 and 140 on inner surfaces, respectively, of the first and second substrates 132 and 134, and lower and upper polarizing plates 142 and 144 on outer surfaces, respectively, of the first and second substrates 132 and 134.

When the LCD device 110 has a normally black mode, the liquid crystal layer 136 changes a polarization state of a light passing through the liquid crystal layer 136 by application of a voltage, and polarization axes (or transmission axes) of the lower and upper polarizing plates 142 and 144 are disposed perpendicular to each other.

The lower and upper alignment layers 138 and 140 determine an initial alignment state of the liquid crystal layer 136.

In the LCD device 110, since the QR 154 of the QR layer 124 is aligned along a specific direction by the photo-induced polymer 150, the QR layer 124 emits a light of a polarized state along the specific direction.

The light source part 122 emits a first light L1 of a non-polarized state and the QR layer 124 emits a second light L2 of a polarized state using the first light L1. A polarization direction of the second light L2 may be determined parallel to a polarization axis (a transmission axis) of the lower polarizing plate 142.

Since the polarization direction of the second light L2 is parallel to the polarization axis of the lower polarizing plate 142, the second light L2 intactly passes through the lower polarizing plate 142 without a loss to becomes a third light L3 of a polarized state parallel to the polarization axis of the lower polarizing plate 142. While the third light L3 passes through the liquid crystal layer 136 where a voltage is applied, a polarization state of the third light L3 is changed and the third light L3 becomes a fourth light L4 of a polarized state parallel to a polarization axis of the upper polarizing plate 144. The fourth light L4 passes through the upper polarizing plate 144 and a fifth light L5 of a polarized state parallel to the polarization axis of the upper polarizing plate 144 is emitted from the LCD device 110.

Here, since the second light L2 has only a component parallel to the polarization axis of the lower polarizing plate 142, the intensity of the part of the second light L2 absorbed by the lower polarizing plate 142 is minimized and the intensity of the part of the second light L2 passing through the lower polarizing plate 142 is maximized. As a result, an optical efficiency and a brightness of the LCD device 110 are improved.

In addition, since the brightness of the LCD device 110 increases due to minimization of light loss, the QR layer 124 is formed to include a relatively small amount of the QR 154. As a result, the fabrication cost of the QR layer 124 is reduced. Further, since the usage of a material for the QR, e.g., a material of a cadmium (Cd) family is minimized, the LCD device 110 may become free from an environmental regulation. Moreover, increase in the brightness of the LCD device 110 may be realized as a product of reduced power consumption.

The QR layer 124 may be formed through a soluble process using a QR composition solution including the photo-induced polymer 150, the QR 154 and a solvent.

FIGS. 3A to 3D are perspective views showing a method of fabricating a quantum rod layer according to a first embodiment of the present invention.

In FIG. 3A, after a quantum rod (QR) composition layer 126 is formed on a base layer by coating a QR composition solution through a soluble process such as an inkjet, a dispensing, a roll-to-roll, a spin coating and a slit coating, an ultraviolet (UV) ray of an polarized state is irradiated onto the QR composition layer 126.

The UV ray may have a wavelength within about 200 nm to about 400 nm, e.g., about 254 nm, about 313 nm and about 365 nm. While the UV ray having a polarization direction parallel to a y-axis direction and a rectangular shape is irradiated onto the QR composition layer 126, a UV source or the base layer may move along an x-axis direction. As a result, the UV ray may be irradiated onto the entire surface of the QR composition layer 126.

The QR composition solution includes the photo-induced polymer 150, the QR 154 and the solvent. Here, a surface treatment may be performed for a shell of the QR 154 so that the QR 154 can be easily dispersed into the photo-induced polymer 150 and have a proper interaction. As a result, a degree of an alignment of the QR layer 124 finally formed may be further improved.

In addition, after the QR composition layer 126 is formed and before the UV ray is irradiated, the solvent may be partially removed from the QR composition layer 126 by performing a heat treatment of a temperature equal to or smaller than about 150 degrees Celsius for the QR composition layer 126.

In the QR composition solution, the photo-induced polymer 150 functions as a host aligned along a specific direction by irradiation of the UV ray, and the QR 154 functions as a guest aligned along an alignment direction of the photo-induced polymer 150. While the photo-induced polymer 150 is randomly disposed in a region B of the QR composition layer 126 where the UV ray is not irradiated, the photo-induced polymer 150 is aligned along the direction (i.e., the x-axis direction) perpendicular to the polarization direction of the UV ray in a region A of the QR composition layer 126 where the UV ray having the polarization direction parallel to the y-axis direction and the QR 154 as a guest of the QR composition solution 126 is also aligned along the alignment direction of the photo-induced polymer 150.

The photo-induced polymer 150 includes a base polymer and a photo-reactive group. The base polymer maintains mechanical and chemical properties of the photo-induced polymer 150. For example, the base polymer may include one of polyethylene (PE), polyethylene terephthalate (PET), polyimide (PI), polyacrylate (PA) and polyester.

The photo-reactive group aligns the base polymer by sensing the UV ray. Specifically, the photo-reactive group may uniaxially align the base polymer in response to the UV ray and may be chemically combined to a main chain or a side chain of the base polymer.

The photo-reactive group includes a material having one of a photo-isomerization reaction (trans↔cis), a photo-crosslinking reaction and a photo-decomposition reaction.

First, the photo-reactive group having the photo-isomerization reaction may include one of azobenzene reacting to light or heat according to the following chemical reaction formula 1 and a moiety of a stilbene group reacting to light or heat according to the following chemical reaction formula 2.

[Chemical Reaction Formula 1]

trans-azobenzene    cis-azobenzene

[Chemical Reaction Formula 2]

E-stilbene    Z-stilbene

In the photo-induced polymer 150, for example, while trans-azobenzene or E-stilbene that is aligned along a direction parallel to the polarization direction of the UV ray is modified to cis-azobenzene or Z-stilbene, respectively, by irradiation of the UV ray, trans-azobenzene or E-stilbene that is aligned along a direction perpendicular to the polarization direction of the UV ray may not be modified even by irradiation of the UV ray.

In addition, trans-azobenzene or E-stilbene may be modified to cis-azobenzene or Z-stilbene, respectively, by the UV ray having a wavelength within a range of about 200 nm to about 400 nm, and cis-azobenzene or Z-stilbene may be modified to trans-azobenzene or E-stilbene, respectively, by the visible ray having a wavelength within a range of about 380 nm to about 780 nm or the heat.

When the visible ray is irradiated with the polarized UV ray, cis-azobenzene or Z-stilbene modified by the UV ray is re-modified to trans-azobenzene or E-stilbene, respectively, by the visible ray. A part of the photo-induced polymer 150 including re-modified trans-azobenzene or E-stilbene may be aligned along a direction perpendicular to the polarization direction of the UV ray.

Accordingly, the degree of alignment and the uniaxial alignment the photo-induced polymer 150 due to the photo-reactive group may be further improved by irradiating the polarized UV ray having a wavelength within a range of about 200 nm to about 400 nm together with the visible ray having a wavelength within a range of about 380 nm to about 780 nm.

Second, the photo-reactive group having the photo-crosslinking reaction may include a photo-dimerization material, e.g., one of cinnamate, coumarin, chalcone, maleimide and anthracenyl group in the following chemical formulas 1 to 5, respectively, and their derivatives.

[Chemical Formula 1]

[Chemical Formula 2]

[Chemical Formula 3]

[Chemical Formula 4]

[Chemical Formula 5]

In cinnamate, 2+2 cycloaddition reaction occurs by light or heat according to the following chemical reaction formula 3. In coumarin, chalcone and maleimide, similarly, 2+2 cycloaddition reaction occurs by light.

[Chemical Reaction Formula 3]

In anthracenyl group, 4+4 cycloaddition reaction occurs by light or heat according to the following chemical reaction formula 4.

[Chemical Reaction Formula 4]

[Chemical Formula 6]

[Chemical Formula 7]

Here, each of A to D may be one of hydrogen group, methyl group and ethyl group.

In the photo-induced polymer 150, for example, while cinnamate, coumarin, chalcone, maleimide or anthracenyl group that is aligned along a direction parallel to the polarization direction of the UV ray is modified to dimerized cinnamate, dimerized coumarin, dimerized chalcone, dimerized maleimide or dimerized anthracenyl group, respectively, through 2+2 cycloaddition reaction or 4+4 cycloaddition reaction by irradiation of the UV ray, cinnamate, coumarin, chalcone, maleimide or anthracenyl group that is aligned along a direction perpendicular to the polarization direction of the UV ray may not be modified even by irradiation of the UV ray.

The reaction may occur in the photo-reactive group having the photo-crosslinking reaction even by a relatively low irradiation energy of the UV ray as compared with the photo-reactive group having the photo-isomerization reaction.

In addition, cinnamate, coumarin, chalcone, maleimide or anthracenyl group may be modified to dimerized cinnamate, dimerized coumarin, dimerized chalcone, dimerized maleimide or dimerized anthracenyl group, respectively, by the UV ray having a wavelength within a range of about 200 nm to about 400 nm, and dimerized cinnamate, dimerized coumarin, dimerized chalcone, dimerized maleimide or dimerized anthracenyl group may be modified to cinnamate, coumarin, chalcone, maleimide or anthracenyl group, respectively, by the visible ray having a wavelength within a range of about 380 nm to about 780 nm or the heat.

When the visible ray is irradiated with the polarized UV ray, dimerized cinnamate, dimerized coumarin, dimerized chalcone, dimerized maleimide or dimerized anthracenyl group modified by the UV ray is re-modified to cinnamate, coumarin, chalcone, maleimide or anthracenyl group. A part of the photo-induced polymer 150 including re-modified cinnamate, coumarin, chalcone, maleimide or anthracenyl group may be aligned along a direction perpendicular to the polarization direction of the UV ray.

Accordingly, similarly to the photo-reactive group having the photo-isomerization reaction, the degree of alignment and the uniaxial alignment the photo-induced polymer 150 due to the photo-reactive group having the photo-crosslinking reaction may be further improved by irradiating the polarized UV ray having a wavelength within a range of about 200 nm to about 400 nm together with the visible ray having a wavelength within a range of about 380 nm to about 780 nm.

Third, the photo-reactive group having the photo-decomposition reaction may include a photo-decomposition material, e.g., dianhydride including cyclobutane reacting to light according to the following chemical formula 6 or 7 and its derivative.

In the photo-induced polymer 150, for example, while dianhydride that is aligned along a direction parallel to the polarization direction of the UV ray is modified to a small molecule due to cutting of cyclobutane by irradiation of the UV ray, dianhydride may not be modified even by irradiation of the UV ray.

To improve the alignment property and the degree of alignment, the photo-induced polymer 150 may further include a mesogen having a liquid crystal phase, and the mesogen may be chemically combined to the base polymer or the photo-reactive group.

The mesogen may have a rod-like shape. For example, the mesogen may include biphenyl in the following chemical formula 8 where at least two rigid aromatic rings or at least two aliphatic rings are connected, a compound of phenyl in the following chemical formula 9 carboxyl group between aromatic rings and benzoate in the following chemical formula 10, and their derivatives in the following chemical formulas 11 to 13.

[Chemical Formula 8]

[Chemical Formula 9]

[Chemical Formula 10]

[Chemical Formula 11]

[Chemical Formula 12]

-continued

[Chemical Formula 13]

Here, each of X and Y may be a material including at least one of carbon and oxygen.

Specifically, when the mesogen is combined to the photo-reactive group, the QR 154 may be more effectively aligned through the alignment property due to the UV ray and the crystallinity alignment of the liquid crystal.

In FIG. 3B, when irradiation of the polarized UV ray onto the entire surface of the QR composition layer 126 is completed, the photo-induced polymer 150 of the QR composition layer 126 aligned along a direction parallel to the polarization direction of the UV ray becomes the modified polymer 152 via structure change, and the photo-induced polymer 150 of the QR composition layer 126 aligned along a direction not parallel to the polarization direction of the UV ray intactly remains without modification.

In FIG. 3C, after irradiation of the polarized UV ray is completed, a heat treatment is performed for the QR composition layer 126 at a temperature within a range of about 120 degrees Celsius to about 250 degrees Celsius for a time period shorter than about 1 hour.

Since the photo-induced polymer 150 that is firstly aligned by the UV ray is re-aligned along a target direction or an average direction (e.g., the direction perpendicular to the polarization direction of the UV ray, the x-axis direction) by the heat treatment, a uniform alignment process is obtained even for a large area.

The photo-induced polymer 150 aligned along a direction parallel to the polarization direction of the UV ray becomes the modified polymer 152 by the UV ray and the modified polymer 152 becomes a re-modified polymer 156 by the heat treatment. Since a part of the re-modified polymer 156 is aligned along a direction perpendicular to the polarization direction of the UV ray, the degree of alignment of the QR composition layer 126 is improved due to the re-modified polymer 156.

For example, when the photo-induced polymer 150 includes the photo-reactive group having the photo-isomerization reaction, cis-azobenzene or Z-stilbene modified by the UV ray is re-modified to trans-azobenzene or E-stilbene, respectively, by the heat treatment, and a part of the re-modified polymer 156 including re-modified trans-azobenzene or re-modified E-stilbene may be aligned along a direction perpendicular to the polarization direction of the UV ray.

In addition, when the photo-induced polymer 150 includes the photo-reactive group having the photo-cross-linking reaction, dimerized cinnamate, dimerized coumarin, dimerized chalcone, dimerized maleimide or dimerized anthracenyl group modified by the UV ray is re-modified to cinnamate, coumarin, chalcone, maleimide or anthracenyl group by the heat treatment, and a part of the re-modified polymer 156 including re-modified cinnamate, re-modified coumarin, re-modified chalcone, re-modified maleimide or re-modified anthracenyl group may be aligned along a direction perpendicular to the polarization direction of the UV ray.

Further, when the photo-induced polymer 150 includes the photo-reactive group having the photo-decomposition reaction, the small molecule modified from dianhydride by the UV ray is vaporized to be removed by the heat treatment, and only the photo-induced polymer 150 including dianhydride aligned along a direction perpendicular to the polarization direction of the UV ray may remain.

As the photo-induced polymer 150 and the re-modified polymer 156 of the QR composition layer 126 are aligned and re-aligned along a direction perpendicular to the polarization direction, the QR 154 in the QR composition solution 126 as a guest is aligned and re-aligned along an alignment direction of the photo-induced polymer 150 and the re-modified polymer 156.

In addition, when the photo-induced polymer 150 includes the mesogen as well as the base polymer and the photo-reactive group, the uniform degree of alignment of the QR 154 may be further improved due to the mesogen re-aligned through the heat treatment after irradiation of the UV ray.

Moreover, the QR composition layer 126 may be cured by completely removing the solvent of the QR composition layer 126 through the heat treatment.

In FIG. 3D, the solvent is removed by irradiation of the UV ray and the heat treatment, and the photo-induced polymer 150 and the QR 154 of the QR composition layer 126 are aligned and re-aligned along a direction (e.g., the x-axis direction) perpendicular to the polarization direction of the UV ray. As a result, a uniform and improved degree of alignment for the large sized QR composition layer 126 is obtained and the QR layer 124 emitting the polarized light is completed.

Here, the photo-induced polymer 150 aligned and re-aligned along a direction (e.g., the x-axis direction) perpendicular to the polarization direction of the UV ray may include a first photo-induced polymer 150a aligned along a direction perpendicular to the polarization direction of the UV ray when the QR composition layer 126 is formed and a second photo-induced polymer 150b aligned along a direction perpendicular to the polarization direction of the UV ray due to re-modification by irradiation of the UV ray and the heat treatment.

In addition, the completed QR layer 124 may include the modified polymer 152 whose structure is changed by irradiation of the UV ray. Since an amount of the modified polymer 152 is relatively small, the degree of alignment may not be deteriorated by the modified polymer 152 and the QR layer 124 may have a uniform degree of alignment.

In the first embodiment, the QR composition layer 126 is formed by using the QR composition solution including the photo-induced polymer 150, the QR 154 and the solvent, and irradiation of the UV ray and the heat treatment are performed for the QR composition layer 126. As a result, the QR layer 124 having a uniform degree of alignment along a direction perpendicular to the polarization direction of the UV ray and emitting a polarized light is obtained.

Further, an optical efficiency and a brightness of the LCD device 110 are improved by disposing the QR layer 124 between the light source part 122 of the backlight unit 120 and the lower polarizing plate 142 of the liquid crystal panel 130 and the LCD device 110 become free from an environmental regulation.

Although the QR layer 124 is disposed between the light source part 122 of the backlight unit 120 and the lower polarizing plate 142 of the liquid crystal panel 130 in the first embodiment, the QR layer may be used as a lower polarizing plate of the liquid crystal panel in another embodiment.

Figure 4:
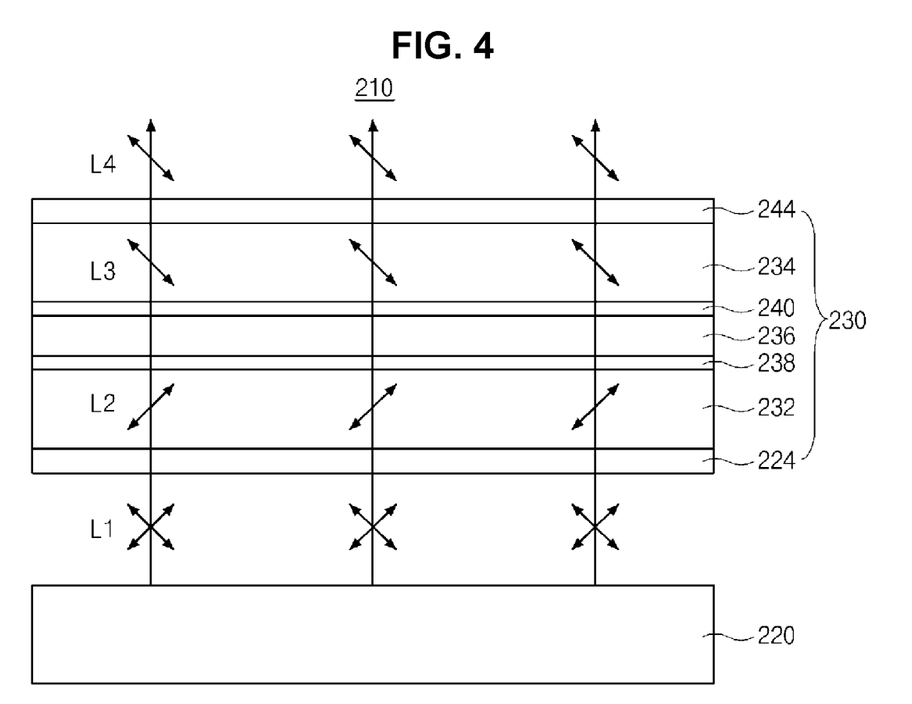
FIG. 4 illustrates a liquid crystal display device including a quantum rod layer according to a second embodiment of the present invention.

FIG. 4 is a liquid crystal display device including a quantum rod layer according to a second embodiment of the present invention, and an illustration for the same part as the first embodiment may be omitted.

In FIG. 4, a liquid crystal display (LCD) device 210 according to a second embodiment of the present invention includes a backlight unit 220 supplying a light and a liquid crystal panel 230 displaying an image using the light of the backlight unit 220.

The backlight unit 220 includes a light source part (not shown) emitting a light and the light source part may emit a blue colored light.

For example, the light source part of an edge type may include a light source such as a light emitting diode (LED) emitting a blue colored light and a light guide plate disposed at a side of the light source and transmitting the light of the light source by changing a path. In addition, the light source part of a direct type may include a light source such as an LED emitting a blue colored light and an optical sheet over the light source and transmitting the light of the light source uniformly.

The liquid crystal panel 230 includes first and second substrates 232 and 234 facing and spaced apart from each other, a liquid crystal layer interposed between the first and second substrates 232 and 234, lower and upper alignment layers 238 and 240 on inner surfaces, respectively, of the first and second substrates 232 and 234, a quantum rod (QR) layer 224 on an outer surface of the first substrate 232, and an upper polarizing plate 244 on an outer surface of the second substrate 234.

Here, the QR layer 224 may improve an optical efficiency of the backlight unit 220 and may function as a lower polarizing plate.

When the LCD device 210 has a normally black mode, the liquid crystal layer 236 changes a polarization state of a light passing through the liquid crystal layer 236 by application of a voltage, and a polarization direction of the light emitted from the QR layer 224 and a polarization axis (or a transmission axis) of the upper polarizing plate 244 are disposed perpendicular to each other.

The lower and upper alignment layers 238 and 240 determine an initial alignment state of the liquid crystal layer 236.

The QR layer 224 may emit a white colored light of a polarized state having a peak at wavelengths corresponding to red, green and blue colors using the blue colored light.

For example, the QR layer 224 may emit a light having full width at half maximums (FWHMs) of about 36 nm, about 50 nm and about 23 nm at wavelengths of about 650 nm, about 550 and about 450 nm, respectively.

The QR layer 224 may include a photo-induced polymer, a modified polymer and a QR. Since the function and the structure of the photo-induced polymer, the modified polymer and the QR are the same as those of the first embodiment, detailed illustrations are omitted.

The QR layer 224 may be formed directly on the liquid crystal panel 230. Alternatively, the QR layer 224 may be formed as a film including at least one of a base layer such as tri acetyl cellulose (TAC), an adhesive layer, a moisture blocking layer, a contamination preventing layer and an optical compensating layer thereon or thereunder and the film of the QR layer 224 may be attached to the liquid crystal panel 230.

In the LCD device 210, since the QR of the QR layer 224 is aligned along a specific direction by the photo-induced polymer, the QR layer 224 emits a light of a polarized state along the specific direction.

The backlight unit 220 emits a first light L1 of a non-polarized state and the QR layer 224 emits a second light L2 of a polarized state using the first light L1.

While the second light L2 passes through the liquid crystal layer 236 where a voltage is applied, a polarization state of the second light L2 is changed and the second light L2 becomes a third light L3 of a polarized state parallel to a polarization axis of the upper polarizing plate 244. The third light L3 passes through the upper polarizing plate 244 and a fourth light L4 of a polarized state parallel to the polarization axis of the upper polarizing plate 244 is emitted from the LCD device 210.

Here, since the QR layer 224 emits the second light L2 of the polarized state by using substantially the whole first light L1, the intensity of the part of the first light L1 of the non-polarized state absorbed by the QR layer 224 is minimized and the intensity of the part of the first light L1 incident to the liquid crystal layer 236 is maximized. As a result, an optical efficiency and a brightness of the LCD device 210 are improved.

In addition, since the brightness of the LCD device 210 increases due to minimization of light loss, the QR layer 224 is formed to include a relatively small amount of the QR. As a result, the fabrication cost of the QR layer 224 is reduced. Further, since the usage of a material for the QR, e.g., a material of a cadmium (Cd) family is minimized, the LCD device 210 may become free from an environmental regulation. Moreover, increase in the brightness of the LCD device 210 may be realized as a product of reduced power consumption. Furthermore, since the number of the polarizing plates is reduced as compared with the LCD device according to the related art, the LCD device 210 having a light weight and a thin profile is obtained by reducing the thickness and the weight.

The QR layer 224 may be formed through a soluble process using a QR composition solution including the photo-induced polymer, the QR and a solvent. Since the fabricating method of the QR layer 224 is the same as that of the first embodiment, detailed illustrations are omitted.

In the second embodiment, the QR composition layer is formed by using the QR composition solution including the photo-induced polymer, the QR and the solvent, and irradiation of the UV ray and the heat treatment are performed for the QR composition layer. As a result, the QR layer 224 having a uniform degree of alignment along a direction perpendicular to the polarization direction of the UV ray and emitting a polarized light is obtained.

Further, an optical efficiency and a brightness of the LCD device 210 are improved by using the QR layer 224 as a lower polarizing plate and the LCD device 210 become free from an environmental regulation.

Although the QR layer 224 is used as a lower polarizing plate in the first embodiment, the QR layer may be used as a lower polarizing plate and a lower alignment layer of the liquid crystal panel in another embodiment.

Figure 5:
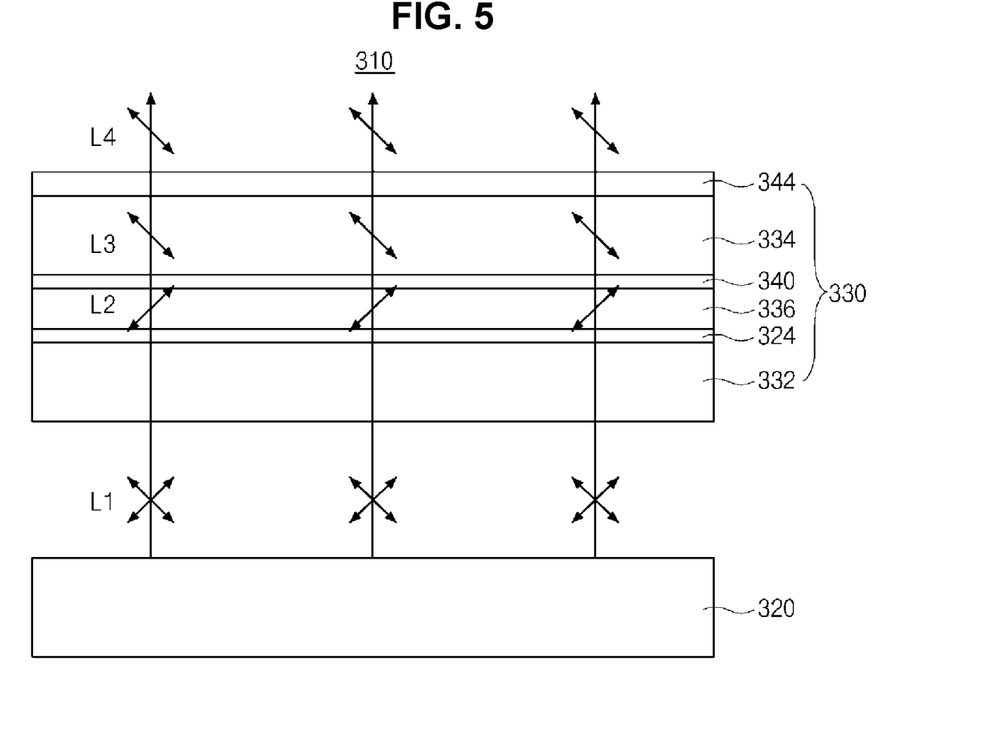
FIG. 5 illustrates a liquid crystal display device including a quantum rod layer according to a third embodiment of the present invention.

FIG. 5 is a liquid crystal display device including a quantum rod layer according to a third embodiment of the present invention, and an illustration for the same part as the first and second embodiments may be omitted.

In FIG. 5, a liquid crystal display (LCD) device 310 according to a third embodiment of the present invention includes a backlight unit 320 supplying a light and a liquid crystal panel 330 displaying an image using the light of the backlight unit 320.

The backlight unit 320 includes a light source part (not shown) emitting a light and the light source part may emit a blue colored light.

For example, the light source part of an edge type may include a light source such as a light emitting diode (LED) emitting a blue colored light and a light guide plate disposed at a side of the light source and transmitting the light of the light source by changing a path. In addition, the light source part of a direct type may include a light source such as an LED emitting a blue colored light and an optical sheet over the light source and transmitting the light of the light source uniformly.

The liquid crystal panel 330 includes first and second substrates 332 and 334 facing and spaced apart from each other, a liquid crystal layer interposed between the first and second substrates 332 and 334, a quantum rod (QR) layer 324 on an inner surface of the first substrate 332, an upper alignment layer 340 on an inner surface of the second substrate 334, and an upper polarizing plate 344 on an outer surface of the second substrate 334.

Here, the QR layer 324 may improve an optical efficiency of the backlight unit 320 and may function as a lower polarizing plate and a lower alignment layer.

When the LCD device 310 has a normally black mode, the liquid crystal layer 336 changes a polarization state of a light passing through the liquid crystal layer 336 by application of a voltage, and a polarization direction of the light emitted from the QR layer 324 and a polarization axis (or a transmission axis) of the upper polarizing plate 344 are disposed perpendicular to each other.

The QR layer 324 and the upper alignment layers 340 determine an initial alignment state of the liquid crystal layer 336.

The QR layer 324 may emit a white colored light of a polarized state having a peak at a wavelength corresponding to red, green and blue colors using the blue colored light.

For example, the QR layer 324 may emit a light having full width at half maximums (FWHMs) of about 36 nm, about 50 nm and about 23 nm at wavelengths of about 650 nm, about 550 and about 450 nm, respectively.

The QR layer 324 may include a photo-induced polymer, a modified polymer and a QR. Since the function and the structure of the photo-induced polymer, the modified polymer and the QR are the same as those of the first and second embodiments, detailed illustrations are omitted or will be brief.

The QR layer 324 may be formed directly in the liquid crystal panel 330. An alignment direction of the QR layer 324 may be parallel to the polarization direction of the light emitted from the QR layer 324.

In addition, a kind and an amount of the QR may be optimized so that the main function of the QR layer 324 as a lower alignment layer cannot be reduced.

In the LCD device 310, since the QR of the QR layer 324 is aligned along a specific direction by the photo-induced polymer, the QR layer 324 emits a light of a polarized state along the specific direction. In addition, the QR layer 324 determines an initial alignment state of a lower part of the liquid crystal layer 336.

The backlight unit 320 emits a first light L1 of a non-polarized state and the QR layer 324 emits a second light L2 of a polarized state using the first light L1. The QR layer 324 also assigns an initial alignment direction to a liquid crystal molecule of a lower portion of the liquid crystal layer 336.

While the second light L2 passes through the liquid crystal layer 336 where a voltage is applied, a polarization state of the second light L2 is changed and the second light L2 becomes a third light L3 of a polarized state parallel to a polarization axis of the upper polarizing plate 344. The third light L3 passes through the upper polarizing plate 344 and a fourth light L4 of a polarized state parallel to the polarization axis of the upper polarizing plate 344 is emitted from the LCD device 310.

Here, since the QR layer 324 emits the second light L2 of the polarized state by using substantially the whole first light L1, the intensity of the part of the first light L1 of the non-polarized state absorbed by the QR layer 324 is minimized and the intensity of the part of the first light L1 incident to the liquid crystal layer 336 is maximized. As a result, an optical efficiency and a brightness of the LCD device 310 are improved.

In addition, since the brightness of the LCD device 310 increases due to minimization of light loss, the QR layer 324 is formed to include a relatively small amount of the QR. As a result, the fabrication cost of the QR layer 324 is reduced. Further, since the usage of a material for the QR, e.g., a material of a cadmium (Cd) family is minimized, the LCD device 310 may become free from an environmental regulation. Moreover, increase in the brightness of the LCD device 310 may be realized as a product of reduced power consumption. Furthermore, since the number of the polarizing plates is reduced as compared with the LCD device according to the related art, the LCD device 310 having a light weight and a thin profile is obtained by reducing the thickness and the weight. Since a process of attaching a polarizing plate is simplified as compared with the LCD device according to the related art, the fabrication cost is reduced.

The QR layer 324 may be formed through a soluble process using a QR composition solution including the photo-induced polymer, the QR and a solvent. Since the fabricating method of the QR layer 324 is the same as that of the first embodiment, detailed illustrations are omitted.

In the third embodiment, the QR composition layer 326 is formed on the inner surface of the first substrate 332 by using the QR composition solution including the photo-induced polymer, the QR and the solvent, and irradiation of the UV ray and the heat treatment are performed for the QR composition layer 326. As a result, the QR layer 324 having a uniform degree of alignment along a direction perpendicular to the polarization direction of the UV ray and emitting a polarized light is obtained.

Further, an optical efficiency and a brightness of the LCD device 310 are improved by using the QR layer 324 as a lower polarizing plate and a lower alignment layer and the LCD device 310 become free from an environmental regulation.

In another embodiment where the light emitted from the QR layer 324 has an incomplete polarization state, a lower polarizing plate may be formed on an outer surface of the first substrate 332 to complement the QR layer 324. The QR layer 324 may functions mainly as a lower alignment layer and may improve a color property of the LCD device 310.

Consequently, in the LCD device according to embodiments of the present invention, since the degree of alignment of the QR is improved by using the photo-induced polymer, the polarization property of the QR layer is improved and the fabrication cost is reduced.

In addition, since the degree of alignment of the QR is improved by using the photo-induced polymer and the QR layer is used as the polarizing plate by improving the polarization property of the QR layer, the fabrication cost is reduced due to omission of the lower polarizing plate, the brightness of the LCD device is improved, and the power consumption of the LCD device is reduced.

Further, since the degree of alignment of the QR is improved by using the photo-induced polymer and the QR layer is used as the polarizing plate and the alignment layer by improving the polarization property and the alignment property of the QR layer, the fabrication cost is reduced due to omission of the lower polarizing plate and the lower alignment layer, the brightness of the LCD device is improved, and the power consumption of the LCD device is reduced.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

Chemical Reaction Formula 1

Chemical Reaction Formula 2

What is claimed is:

1. A liquid crystal display device, comprising:
a light source part emitting a blue colored light;
a quantum rod layer over the light source part, the quantum rod layer emitting a white colored light of a polarized state having a peak at wavelengths corresponding to red, green and blue colors using the blue colored light;
first and second substrates over the light source part, the first and second substrates facing each other and spaced apart from each other;
a liquid crystal layer between the first and second substrates;
a lower alignment layer on an inner surface of the first substrate;
an upper alignment layer on an inner surface of the second substrate; and
an upper polarizing plate on an outer surface of the second substrate,
wherein the lower and upper alignment layers determine an initial alignment state of the liquid crystal layer,
wherein the quantum rod layer comprises:
a photo-induced polymer including a base polymer aligned along a first direction and a photo-reactive group combined to the base polymer; and
a quantum rod aligned along the first direction,
wherein the quantum rod is mixed with the photo-induced polymer to constitute a single layer with the photo-induced polymer,
wherein the quantum rod is uniformly aligned to the first direction by a reaction of the photo-induced polymer,
wherein the light source part has an edge type including a light source and a light guide plate at a side of the light source,
wherein the quantum rod layer directly contacts the light guide plate and the lower polarizing plate,
wherein the photo-reactive group is chemically combined to a main chain and/or a side chain of the base polymer and includes a material having a photo-isomerization reaction; and
wherein the photo-reactive group having the photo-isomerization reaction includes one selected from the group consisting of an azobenzene reacting to a light or a heat according to a following chemical reaction formula 1 and a moiety of a stilbene group reacting to a light or a heat according to a following chemical reaction formula 2:

2. The liquid crystal display device according to claim 1, wherein the base polymer includes one selected from the group consisting of polyethylene (PE), polyethylene terephthalate (PET), polyimide (PI), polyacrylate (PA) and polyester.

3. The liquid crystal display device according to claim 1, wherein the photo-induced polymer includes a first photo-induced polymer aligned along the first direction and a second photo-induced polymer aligned along the first direction due to modification and re-modification by a UV ray and a heat, and
wherein the quantum rod layer further comprises a modified polymer whose structure is changed by the UV ray.

4. The liquid crystal display device according to claim 1, wherein a film including the quantum rod layer and at least one selected from the group consisting of a base layer, an adhesive layer, a moisture blocking layer, a contamination preventing layer and an optical compensating layer on or under the quantum rod layer is formed on one selected from the group consisting of the light source part and the first substrate.

5. A liquid crystal display device, comprising:
a light source part emitting a blue colored light;
a quantum rod layer over the light source part, the quantum rod layer emitting a white colored light of a polarized state having a peak at wavelengths corresponding to red, green and blue colors using the blue colored light;
first and second substrates over the light source part, the first and second substrates facing each other and spaced apart from each other;
a liquid crystal layer between the first and second substrates;
a lower alignment layer on an inner surface of the first substrate;
an upper alignment layer on an inner surface of the second substrate; and
an upper polarizing plate on an outer surface of the second substrate,
wherein the lower and upper alignment layers determine an initial alignment state of the liquid crystal layer,
wherein the quantum rod layer comprises:
a photo-induced polymer including a base polymer aligned along a first direction and a photo-reactive group combined to the base polymer; and a quantum rod aligned along the first direction,
wherein the quantum rod layer is disposed directly on and directly contacts an outer surface of the first substrate to function as a lower polarizing plate,
wherein the photo-reactive group is chemically combined to a main chain and/or a side chain of the base polymer and includes a material having a photo-isomerization reaction; and
wherein the photo-reactive group having the photo-isomerization reaction includes one selected from the group consisting of an azobenzene reacting to a light or a heat according to a following chemical reaction formula 1 and a moiety of a stilbene group reacting to a light or a heat according to a following chemical reaction formula 2:

Chemical Reaction Formula 1 trans-azobenzene     cis-azobenzene

Chemical Reaction Formula 2

E-stilbene     Z-stilbene

6. A liquid crystal display device, comprising:
a light source part emitting a blue colored light;
a quantum rod layer over the light source part, the quantum rod layer emitting a white colored light of a polarized state having a peak at wavelengths corresponding to red, green and blue colors using the blue colored light;
first and second substrates over the light source part, the first and second substrates facing each other and spaced apart from each other;
a liquid crystal layer between the first and second substrates;
an upper alignment layer on an inner surface of the second substrate; and
an upper polarizing plate on an outer surface of the second substrate,
wherein the quantum rod layer and the upper alignment layer determine an initial alignment state of the liquid crystal layer,
wherein the quantum rod layer comprises:
a photo-induced polymer including a base polymer aligned along a first direction and a photo-reactive group combined to the base polymer; and
a quantum rod aligned along the first direction,
wherein the quantum rod layer is disposed between the first substrate and the liquid crystal layer, and
wherein the quantum rod layer directly contacts an inner surface of the first substrate and the liquid crystal layer to function as a lower polarizing plate and a lower alignment layer,
wherein the photo-reactive group is chemically combined to a main chain and/or a side chain of the base polymer and includes a material having a photo-isomerization reaction; and
wherein the photo-reactive group having the photo-isomerization reaction includes one selected from the group consisting of an azobenzene reacting to a light or a heat according to a following chemical reaction formula 1 and a moiety of a stilbene group reacting to a light or a heat according to a following chemical reaction formula 2:

Chemical Reaction Formula 1 trans-azobenzene     cis-azobenzene

Chemical Reaction Formula 2

E-stilbene     Z-stilbene

7. The liquid crystal display device according to claim 6, further comprising a lower polarizing plate on an outer surface of the first substrate.

* * * * *